United States Patent
Park

(10) Patent No.: US 7,687,384 B2
(45) Date of Patent: Mar. 30, 2010

(54) SEMICONDUCTOR DEVICE AND METHOD FOR FABRICATING THE SAME THAT INCLUDES ANGLED IMPLANTATION OF POLY LAYER

(75) Inventor: Jin Ha Park, Echeon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 229 days.

(21) Appl. No.: 11/827,686

(22) Filed: Jul. 13, 2007

(65) Prior Publication Data

US 2008/0020556 A1 Jan. 24, 2008

(30) Foreign Application Priority Data

Jul. 21, 2006 (KR) ............ 10-2006-0068303

(51) Int. Cl.
*H01L 21/426* (2006.01)

(52) U.S. Cl. .............. 438/525; 438/532; 438/585; 257/E21.345

(58) Field of Classification Search .......... 438/491, 438/532
See application file for complete search history.

(56) References Cited

U.S. PATENT DOCUMENTS 6,599,840 B2 * 7/2003 Wu et al. .............. 438/705
6,881,653 B2 * 4/2005 Kojima et al. ............ 438/491

2005/0078725 A1 * 4/2005 Wang ............... 372/45
2005/0285052 A1 * 12/2005 Wang et al. ......... 250/492.21

FOREIGN PATENT DOCUMENTS

CN 1163489 A 10/1997

OTHER PUBLICATIONS

Arai Masatoshi, Sekawa Mizunju and Yabu Toshiki; "Semiconductor Device and Its Producing Method"; esp@cenet; Chinese Publication Number: CN1163489 (A); Publication Date: Oct. 29, 1997; esp@cenet Database—Worldwide.
English Translation of Partial Chinese Office Action dated May 23, 2008; Chinese Patent Application No. 200710137305.7; The State Intellectual Property Office of P.R.C., People's Republic of China.

* cited by examiner

*Primary Examiner*—Stephen W Smoot
(74) *Attorney, Agent, or Firm*—The Law Offices of Andrew D. Fortney; Andrew D. Fortney

(57) ABSTRACT

Provided is a method for fabricating a semiconductor device. In the method, a poly layer on a semiconductor substrate is etched to a predetermined depth. Ions are implanted into the poly layer at a predetermined angle. The poly layer is etched again to expose a portion of the semiconductor substrate. Therefore, stress is applied to the poly gate instead of the barrier layer, so that the barrier layer is not opened during contact etching because effects of the barrier layer thickness can be solved. Also, stress is applied to a poly gate directly contacting a channel region of the semiconductor substrate to allow tensile force caused by the stress of the poly gate to directly induce tensile force to the channel region, and thus increase mobility, so that device characteristics can be remarkably enhanced.

18 Claims, 4 Drawing Sheets

SEMICONDUCTOR DEVICE AND METHOD FOR FABRICATING THE SAME THAT INCLUDES ANGLED IMPLANTATION OF POLY LAYER

CROSS-REFERENCE TO RELATED APPLICATIONS

The present application claims priority under 35 U.S.C. 119 and 35 U.S.C. 365 to Korean Patent Application No. 10-2006-0068303 (filed on Jul. 21, 2006), which is hereby incorporated by reference in its entirety.

BACKGROUND

The present disclosure relates to a semiconductor device, and more particularly, to a method for fabricating the same, that can improve device characteristics.

As semiconductor devices are highly integrated, both the size of a device active region and the channel length of a metal oxide semiconductor (MOS) transistor formed inside the device active region reduce.

As the channel length of the MOS transistor decreases, the probability of electron collisions in the channel length increases, and consequently the mobility of electrons may be reduced. Therefore, the probability of electron collision should be reduced to increase the mobility of electrons.

To solve this limitation, a method of increasing the mobility of electrons by applying stress to a barrier layer 15 used as an etch stop has been proposed in a related art.

In detail, a device isolation region 3 defining active regions is formed in a semiconductor substrate 1, a gate 9 including an oxide layer 5 and a poly gate 7 is formed, an impurity region 11, for example, a source region or a drain region is formed in the active region using the gate 9 as a mask, and a spacer 13 is formed at lateral sides of the gate 9. After that, a barrier layer 15 is formed on the entire surface of the semiconductor substrate 1. The barrier layer 15 can be formed of SiN. Stress is applied to the barrier layer 15.

In this case, tensile force is generated in the barrier layer 15 in the directions from the gate 9 indicated by the arrows due to the stress in the barrier layer 15. Tensile force is also generated in the directions indicated by the arrows in the channel between one source/drain region (e.g., 11) and the other source/drain region due to such tensile force. Accordingly, since a distance between atoms, for example, lattice Si atoms in the channel, is widened, the probability that an electron collides with Si decreases. Therefore, the mobility of the device increases, and consequently the characteristics of the device can improve.

To increase tensile force caused by stress in the channel, the tensile force of the barrier layer 15 should be increased. To increase tensile force of the barrier layer 15, the thickness of the barrier layer 15 should be increased.

However, in the case where the thickness of the barrier layer 15 increases, the barrier layer may not be effectively opened when etching is performed for a contact opening. Therefore, there exists a limit in increasing the thickness of the barrier 15, which also limits an increase in the mobility of electrons.

Therefore, since there exists a limit in increasing the mobility of electrons in a related art semiconductor device, device characteristics cannot be remarkably improved.

SUMMARY

Embodiments provide a method for fabricating a semiconductor device that can increase the mobility of a device using stress applied to a gate to remarkably enhance device characteristics.

In one embodiment, a method for fabricating a semiconductor device, the method includes: forming a poly layer having a predetermined thickness on a semiconductor substrate; etching the poly layer to a predetermined depth using a photoresist pattern as a mask; implanting ions into the poly layer at a predetermined angle with respect to an ion implantation direction; and etching the ion-implanted poly layer using the photoresist pattern as a mask to expose a portion of the semiconductor substrate.

In another embodiment, a semiconductor device includes: a semiconductor substrate; a device isolation region in the semiconductor substrate defining an active region; a gate including a poly gate having implanted Ge ions therein, on a portion of the semiconductor substrate in the active region; an impurity region in the active region; and spacers at lateral sides of the gate.

The details of various embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

FIGS. 2A to 2F are views explaining a fabricating process of a semiconductor device according to an embodiment.

Figure 2A:
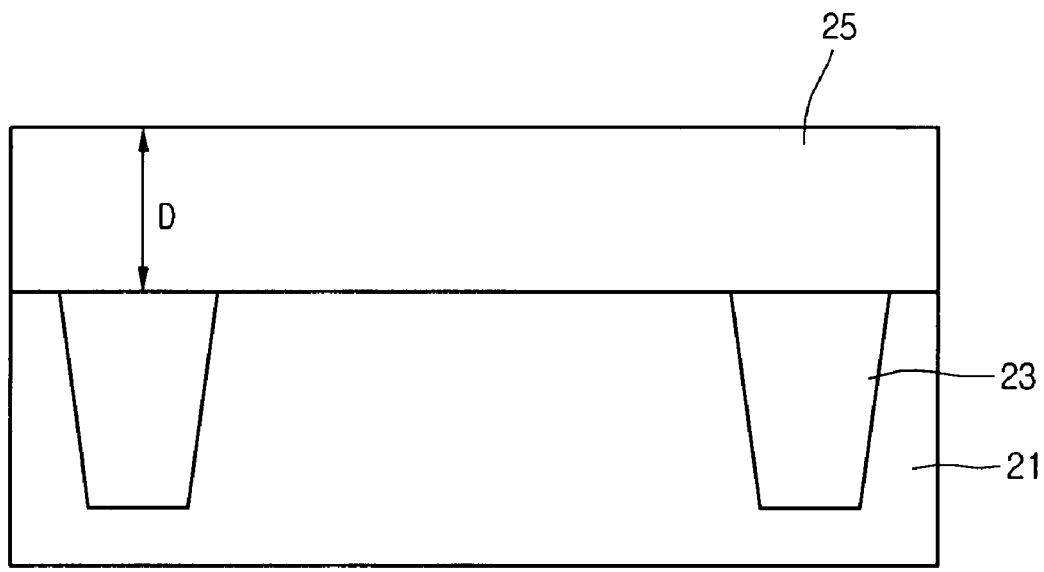
FIGS. 2A to 2F are views explaining a fabricating process of a semiconductor device according to an embodiment of the present disclosure.

Referring to FIG. 2A, one or more device isolation layers 23 defining one or more active regions are formed in a semiconductor substrate 21. Subsequently, the semiconductor substrate 21 is thermally oxidized to grow an oxide layer (not shown). A poly layer 25 is deposited on the oxide layer using a chemical vapor deposition (CVD) process. The poly layer 25 can be formed of (and thus, generally comprises) polysilicon.

The poly layer 25 can be deposited to the thickness of a gate which will be described below. For example, the thickness of the poly layer 25 can be about 15,000 Å. Of course, the poly layer 25 can be formed thinner or thicker than 15,000 Å, depending on a device design.

Figure 2B:
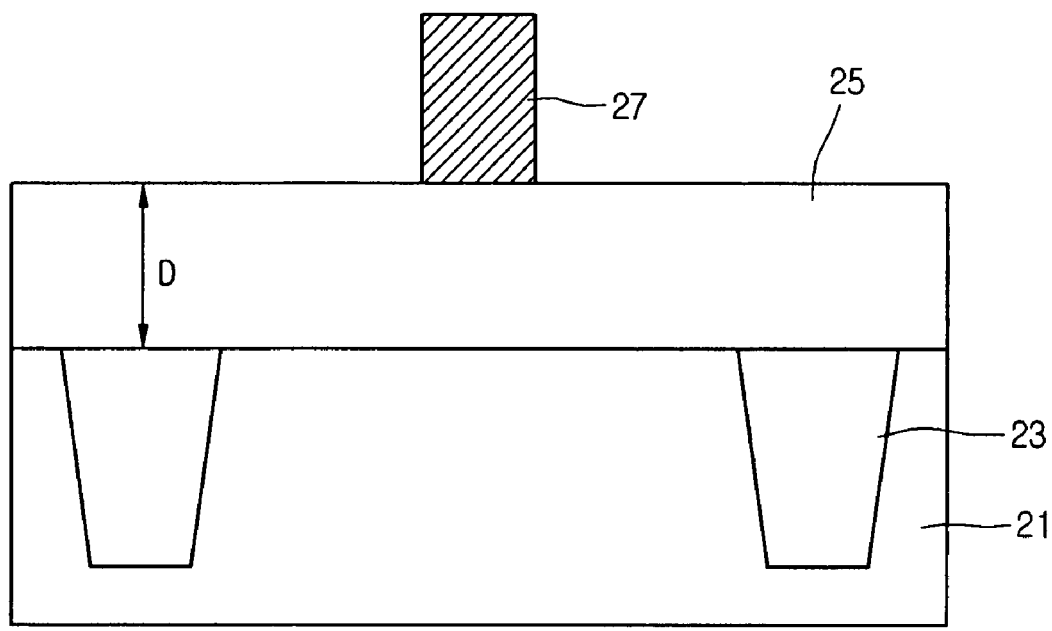

Referring to FIG. 2B, a photoresist pattern 27 for patterning the poly layer 25 is formed on the poly layer 25.

Figure 2C:
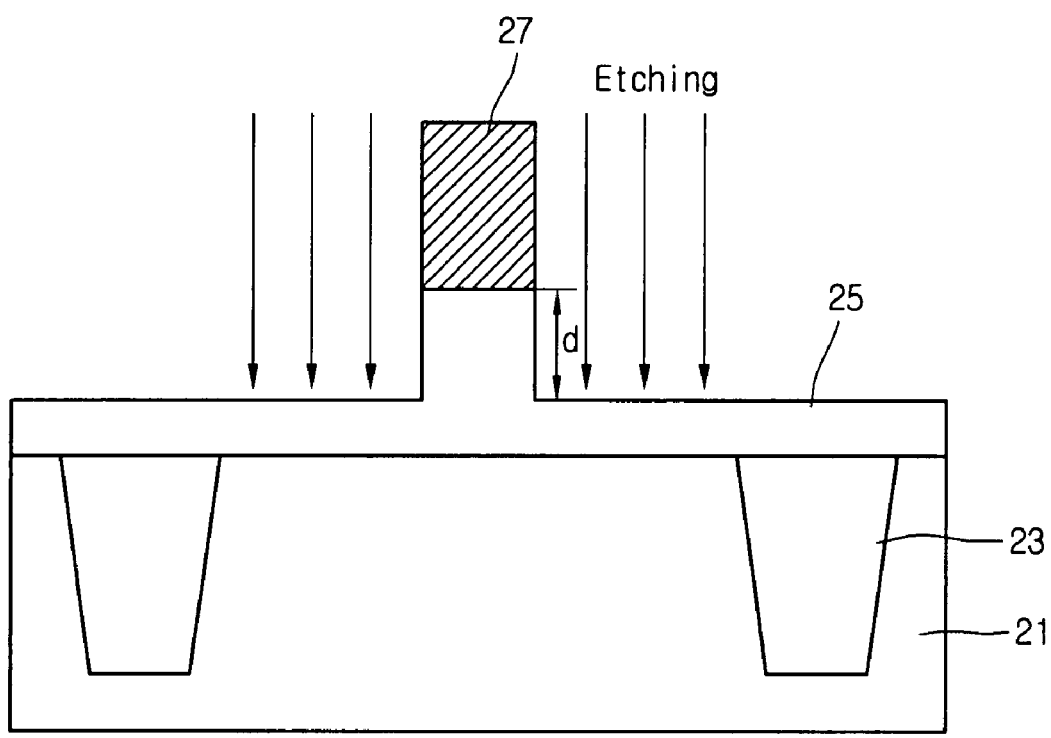

Referring to FIG. 2C, the poly layer 25 is primarily etched to a predetermined depth 'd' using the photoresist pattern 27 as a mask. The etching can be performed on the entire exposed portion of the poly layer 25 (i.e., that excludes or is not covered by the photoresist pattern 27). The predetermined depth 'd' can be about ⅔ of the thickness 'D' of the poly layer 25. For example, the predetermined depth 'd' can be in a range of 60%-80% of the thickness of the poly layer 25.

However, in the case where the predetermined depth 'd' is too small, stress is not sufficiently applied to a poly gate which will be formed later, and so it is difficult to cause stress in the channel. Also, the predetermined depth 'd' is too large, ions implanted into the poly gate to apply stress penetrate into regions of the substrate for subsequent implantation of an impurity region and may change the characteristic(s) of the impurity region and possibly reduce the device characteristics.

Figure 2D:
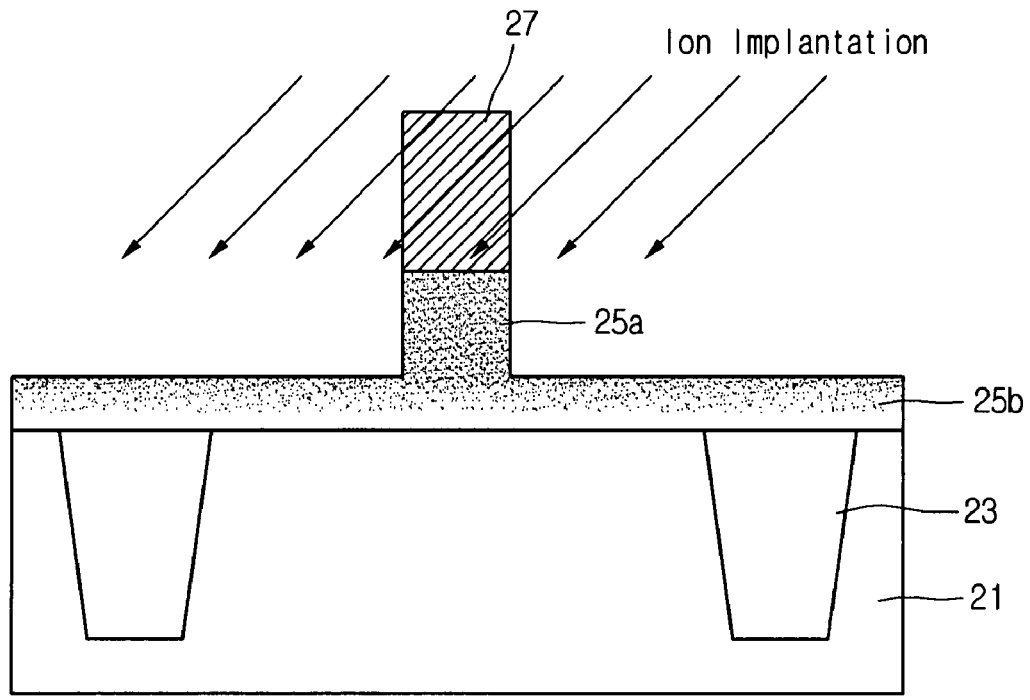

Referring to FIG. 2D, an ion implantation process is performed on the semiconductor substrate 21. In this case, the ion implantation can be performed using one or more dopants, such as Si, Ge, P, As, Sb, Ga and/or In (particularly Ge) at an energy of from 10-100 KeV at an implant angle of from 20-70° with respect to the direction of ion implantation. For example, ion implantation may comprise implanting 74Ge$^+$ at energy of 20 KeV-50 KeV and in a dose of 1 E14-1 E16 ions/cm$^2$, while the semiconductor substrate 21 is tilted at a slope in a range of 35°-55° with respect to an ion implantation direction, and rotated by a predetermined angle unit (or tilt-angle wafer holding and rotating apparatus). The predetermined angle can be 0°, 45°, 180°, and/or 270°. Also, the semiconductor substrate 21 can be rotated at a constant speed regardless of the predetermine angle unit. The energy of 20 KeV-50 KeV is an energy set such that Ge ions do not have an influence on the semiconductor substrate 21 (that is, single-crystal Si in which the source and drain terminals are formed). This energy defines a limit to etching the poly layer 25 to a thickness sufficient to prevent ions from being implanted into the semiconductor substrate 21. In the case where the poly layer 25 has such a thickness that Ge ions cannot penetrate into the poly layer 25, an energy higher than 20 KeV-50 KeV can be used.

Ions are implanted into lateral sides 25a of the poly layer 25 under the photoresist pattern 27 and an exposed, substantially horizontal surface 25b of the poly layer 25 (i.e., where the photoresist pattern 27 does not exist).

Figure 2E:
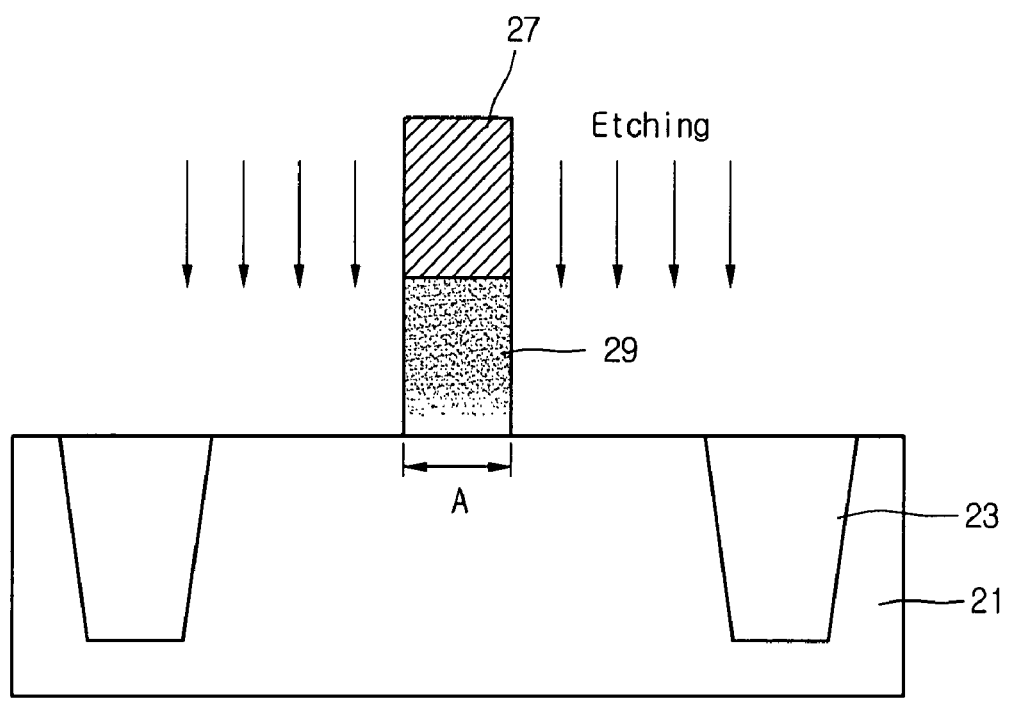

Referring to FIG. 2E, etching is further performed on the surface of the ion implantation-completed semiconductor substrate 21, and more specifically, to expose the active region. The first and second etching processes performed in FIGS. 2C and 2E can be performed by reactive ion etching.

Since the photoresist pattern 27 serves as a mask, the portion 25a of the poly layer 25 under the photoresist pattern is not etched. Therefore, following the second etching process in FIG. 2E, the remaining portion 25b of the poly layer 25 (other than the portion 25a of the poly layer 25) is entirely removed. The portion 25a of the poly layer 25 under the photoresist pattern 27 becomes a poly gate 29, having substantially the same width as that of the photoresist pattern 27.

Figure 2F:
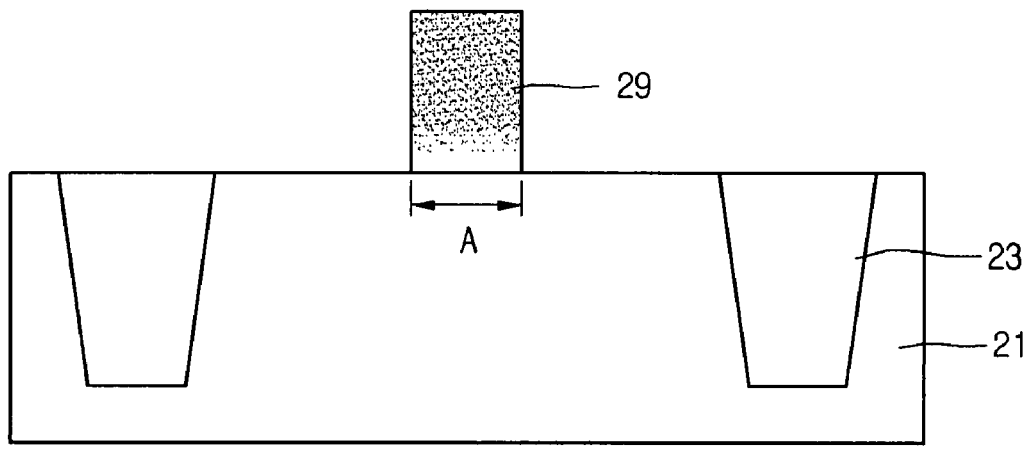

Referring to FIG. 2F, the photoresist pattern 27 is removed through a stripping process to form a gate including the poly gate 29 and the oxide layer (not shown) under the poly gate 29.

In this case, Ge ions (or another dopant) are implanted into the poly gate 29 to generate stress, thereby generating tensile force. Therefore, the tensile force of the poly gate 29 induces another tensile force caused by the stress to a channel region A of the semiconductor substrate 21 that corresponds to the poly gate 29. Since a distance between lattice Si atoms may be widened due to the tensile force on the channel region A, the probability that electrons will collide with Si decreases. Therefore, the mobility of the device increases, and consequently device characteristics can improve.

Particularly, an embodiment applies stress to the poly gate over (or the poly gate directly contacting) the channel region A of the semiconductor substrate to allow tensile force caused by the stress of the poly gate to directly induce another tensile force to the channel region A. Accordingly, the tensile force is induced to the channel region A more reliably, to sufficiently widen a distance between lattice Si atoms to reduce the probability of electron collisions. Accordingly, mobility remarkably increases, and thus device characteristics can be greatly enhanced.

Also, as stress is applied to the poly gate 29, the problem that a thick barrier layer (to increase mobility) is not effectively opened when a contact hole is formed can be solved. Accordingly, a separate and/or additional stress does not need to be applied to the barrier layer.

Figure 1:
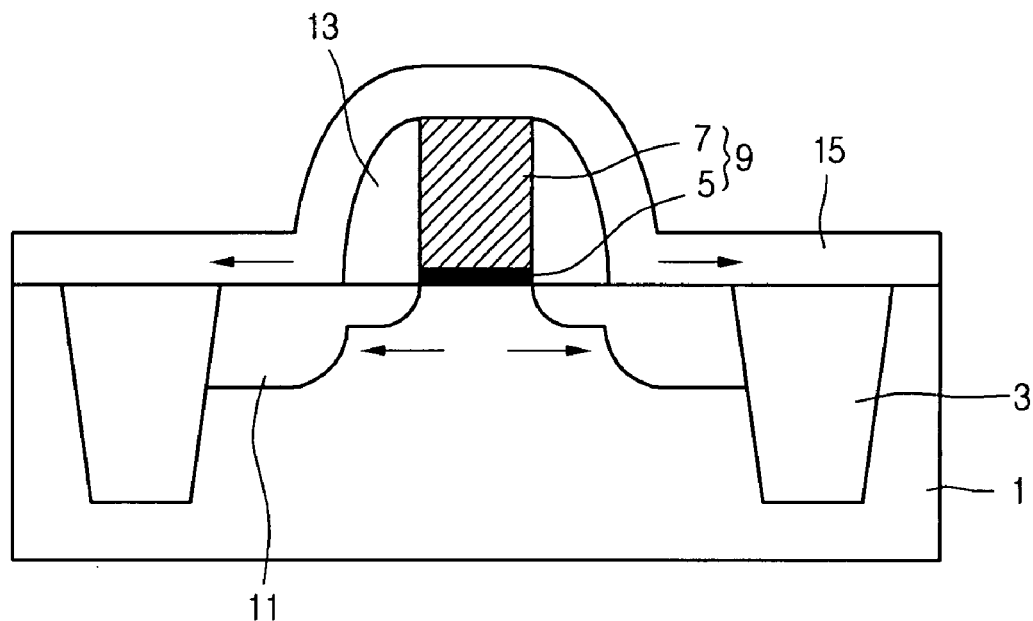
FIG. 1 is a cross-sectional view of a semiconductor device where stress is applied to a barrier layer to increase mobility according to a related art.

After that, an impurity region (not shown), for example, a source region and/or a drain region, can be formed in the active region using the gate as a mask. Spacers 13 are generally formed at lateral sides of the gate prior to ion implantation into the substrate 21 to form the source/drain terminals (e.g., 11 in FIG. 1).

Figure 3:
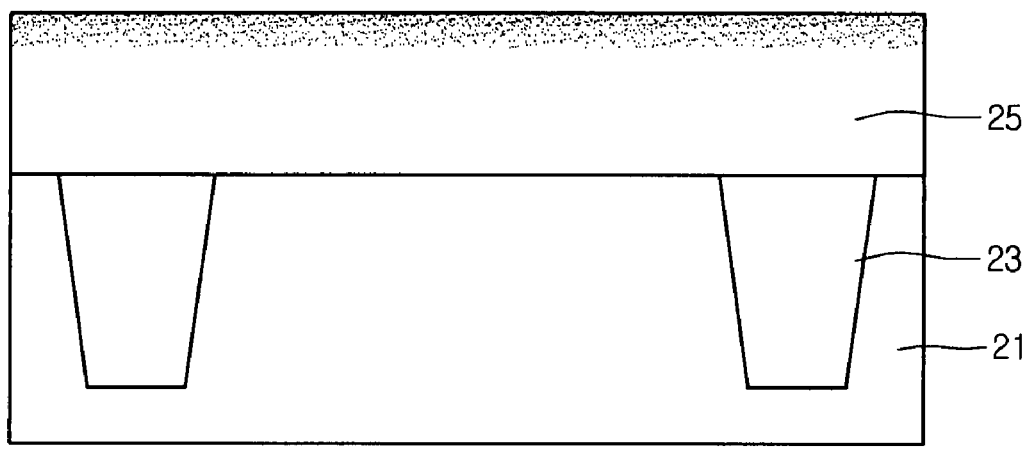
FIG. 3 is a view illustrating a stress defect in the case where ions are not implanted with etching not performed as illustrated in FIG. 2C.

In the above description, the ion implantation process has been performed to apply stress after a first (and partial) etching is performed as illustrated in FIG. 2C. On the other hand, when the ion implantation process is performed without the partial etch, implanted ions are mainly concentrated on the surface of the poly layer 25 because the thickness of the poly layer 25 is relatively large relative to the depth of ion implantation, as illustrated in FIG. 3. Accordingly, stress is mainly generated on the surface of the poly layer 25, and tensile force caused by such stress does not have a great influence on the channel region of the semiconductor substrate. Therefore, it can be difficult to induce tensile force caused by the stress to the channel region without the partial etching process, and thus it is not expected that mobility increases significantly. Referring to FIG. 2C, after the poly layer 25 is etched to a predetermined depth, ion implantation may be performed.

As described above, since stress is applied to the poly gate to increase mobility according to an embodiment, stress does not need to be applied to the barrier layer, and the barrier layer dose not need to be formed thick to increase mobility as in the related art. Therefore, the problem that the barrier layer may not be effectively opened during contact hole etching because of the thickness of the barrier layer can be solved reliably.

Also, according to an embodiment, stress is applied to the poly gate directly contacting the channel region of the semiconductor substrate 21 to allow tensile force cause by the stress of the ion-implanted poly gate to directly induce a tensile force on the channel region of the semiconductor substrate, so that mobility increases, and consequently, device characteristics can be enhanced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although illustrative embodiments have been described herein, it should be understood that numerous other modifications and alternative embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor device, the method comprising:
    forming a poly layer having a predetermined thickness on a semiconductor substrate;
    etching the poly layer to a predetermined depth using a photoresist pattern as a mask, wherein the predetermined depth is in a range of 60%-80% of a thickness of the poly layer;
    implanting ions into the poly layer at a predetermined angle with respect to an ion implantation direction; and
    etching the ion-implanted poly layer using the photoresist pattern as a mask to expose the semiconductor substrate.

2. The method of claim 1, wherein the predetermined depth is about ⅔ of the thickness of the polylayer.

3. The method according to claim 1, wherein the predetermined angle is in a range of 35°-55°.

4. The method according to claim 1, wherein implanting ions comprises implanting Ge at an energy of 20KeV-50 KeV and a dose of 1E14-1E16ions/cm².

5. The method according to claim 4, wherein implanting the Ge ions is done by rotating the semiconductor substrate with a tilted wafer holding unit.

6. The method according to claim 1, wherein implanting ions further comprises rotating the semiconductor substrate with a tilted wafer holding unit.

7. The method according to claim 6, wherein the tilted wafer holding unit has an angle of 0°, 45°, 180°, and/or 270°.

8. The method according to claim 1, wherein implanting ions further comprises rotating the semiconductor substrate at a constant speed.

9. The method according to claim 1, wherein etching the poly layer comprises reactive ion etching.

10. The method according to claim 1, wherein etching the ion-implanted poly layer comprises reactive ion etching.

11. The method according to claim 1, wherein etching the ion-implanted poly forms a gate electrode.

12. The method according to claim 1, wherein the ions are implanted into lateral sides of the poly layer under the photoresist pattern, and a surface of the poly exposed by the photoresist pattern.

13. The method according to claim 1, wherein the thickness of the poly layer is approximately 15,000 Å.

14. The method according to claim 1, wherein the poly layer is formed using a chemical vapor deposition (CVD) process.

15. The method according to claim 1, wherein implanting ions comprises implanting Ge at an energy of 20 KeV 50 KeV.

16. The method according to claim 1, wherein implanting ions comprises implanting Ge at a dose of 1E14-1E16ions/cm².

17. The method according to claim 1, wherein a photoresist pattern is formed on the poly layer prior to etching the poly layer to the predetermined depth.

18. The method according to claim 1, wherein implanting the ions is done at an implant angle of from 20°-70°.

* * * * *